United States Patent
van Veldhoven et al.

(10) Patent No.: US 8,669,761 B2
(45) Date of Patent: Mar. 11, 2014

(54) STRAY-FIELD SENSOR CIRCUIT AND METHOD

(75) Inventors: Robert Hendrikus Margaretha van Veldhoven, Dommelen (NL); Victor Zieren, Valkenswaard (NL)

(73) Assignee: NXP B.V., Eindhoven (NL)

( * ) Notice: Subject to any disclaimer, the term of this patent is extended or adjusted under 35 U.S.C. 154(b) by 395 days.

(21) Appl. No.: 12/969,033

(22) Filed: Dec. 15, 2010

(65) Prior Publication Data

US 2012/0153942 A1    Jun. 21, 2012

(51) Int. Cl.
  *G01R 33/12* (2006.01)
  *G01N 27/72* (2006.01)
(52) U.S. Cl.
  USPC ............... 324/228; 324/76.11; 324/117 R; 324/225
(58) Field of Classification Search
  USPC ............ 324/228, 225, 117 R, 76.11
  See application file for complete search history.

(56) References Cited

U.S. PATENT DOCUMENTS

| 8,203,329 B2 | 6/2012 | Hohe et al. |
| 2010/0117638 A1 | 5/2010 | Yamashita et al. |

FOREIGN PATENT DOCUMENTS

DE    102007041230 B3    4/2009

OTHER PUBLICATIONS

2003, H. Anzai, Y. Tosaka, K. Suzuki, T. Nomura and S. Satoh, "*Equivalent Circuit Model of ESD Protection Devices*," Fujitsu Sci. Tech. J., vol. 39, No. 1, pp. 119-127 (Jun. 2003).

Extended European Search Report for European patent appln. No. 11193021.0 (Apr. 5, 2012).

*Primary Examiner* — Reena Aurora

(57) ABSTRACT

A sensor circuit is configured and operated in the presence of interference. In connection with various example embodiments, a stray magnetic field is sensed with current sensors that also respectively sense current-induced magnetic fields generated by current flowing in opposing directions through different portions of a conductor. The current-induced magnetic fields and the stray magnetic field are coplanar, and the current sensors are arranged such that a portion of the output from each current sensor corresponding to the stray magnetic field is canceled when the sensor outputs are combined.

20 Claims, 3 Drawing Sheets

STRAY-FIELD SENSOR CIRCUIT AND METHOD

Various aspects of the present invention are directed to magnetic sensors, and more particularly to magnetic sensors that are amenable to implementation in the presence of stray fields.

Magnetic sensors are increasingly important in various applications and industries. For example, magnetic sensors are often implemented in automotive applications. Magnetic parking sensors, angular sensors, ABS (Anti-lock Braking System) sensors and tire pressure sensors are used extensively in modern vehicles. These and other types of sensors have been useful for improving comfort and safety. Magnetic sensors are particularly useful in automotive applications, because magnetic fields penetrate easily through most materials. Magnetic sensors are also highly insensitive to dirt and other conditions that may be challenging, for example, to the proper operation of optical sensors.

While useful in these and other applications and industries, many magnetic sensors are susceptible to interference, which can interfere with the magnetic sensor's ability to detect the field attributable to the current flow. For instance, stray magnetic fields may be present in a variety of applications, such as automotive applications, due to ambient conditions pertaining to the particular application.

Stray or other magnetic field interference continues to be challenging, particularly in the production of sensors that are relatively straightforward to manufacture at a reasonable cost. Accordingly, stray fields have been troublesome for a variety of sensor applications.

Various example embodiments are directed to stray field compensation for a variety of devices, including those discussed above, and to such applications involving these devices.

In connection with an example embodiment, a current sensor circuit includes first and second magnetic field sensors. The first magnetic field sensor senses a stray magnetic field and a first current-induced magnetic field generated by current flow through a conductor. The second magnetic field sensor senses the stray magnetic field and a second current-induced magnetic field generated by the current flow through the conductor, with the second current-induced magnetic field being opposite the first current-induced magnetic field sensed by the first magnetic field sensor. The current-induced magnetic fields and the stray magnetic field are coplanar, and each magnetic field sensor circuit provides an output that, when combined, cancel a portion of each output corresponding to the stray magnetic field.

Another example embodiment is directed to an integrated circuit chip having a semiconductor substrate, a conductor that is in the substrate arranged to flow current in opposite directions, magnetic field sensors and an output circuit. A first one of the magnetic field sensors is located over a first portion of the conductor in the substrate, and senses a stray magnetic field and a first current-induced magnetic field generated by current flowing through the first portion of the conductor, the stray magnetic field and the first current-induced magnetic field being coplanar. A second one of the magnetic field sensors is located over a second portion of the conductor in the substrate, and senses the stray magnetic field and a second current-induced magnetic field generated by current flowing through the second portion of the conductor. The second current-induced magnetic field is opposite the first current-induced magnetic field sensed by the first magnetic field sensor, and the stray magnetic field and the second current-induced magnetic field are coplanar. An output circuit processes outputs of the sensors to cancel the portions of each output corresponding to the stray magnetic field, and provides a result of the processing as an output indicative of an amount of current flowing through the conductors.

Another example embodiment is directed to a method for sensing current. Using a first magnetic field sensor, a stray magnetic field and a first current-induced magnetic field generated by current flow through a conductor are both sensed. A second magnetic field sensor is used to sense the stray magnetic field and a second current-induced magnetic field generated by the current flow through the conductor, the second current-induced magnetic field being opposite the first current-induced magnetic field sensed by the first magnetic field sensor, the current-induced magnetic fields and the stray magnetic field being coplanar. The outputs of each magnetic field sensor circuit, when combined, cancel a portion of each output corresponding to the stray magnetic field.

The above discussion is not intended to describe each embodiment or every implementation of the present disclosure. The figures and following description also exemplify various embodiments.

Various example embodiments may be more completely understood in consideration of the following detailed description in connection with the accompanying drawings, in which.

Figure 1:
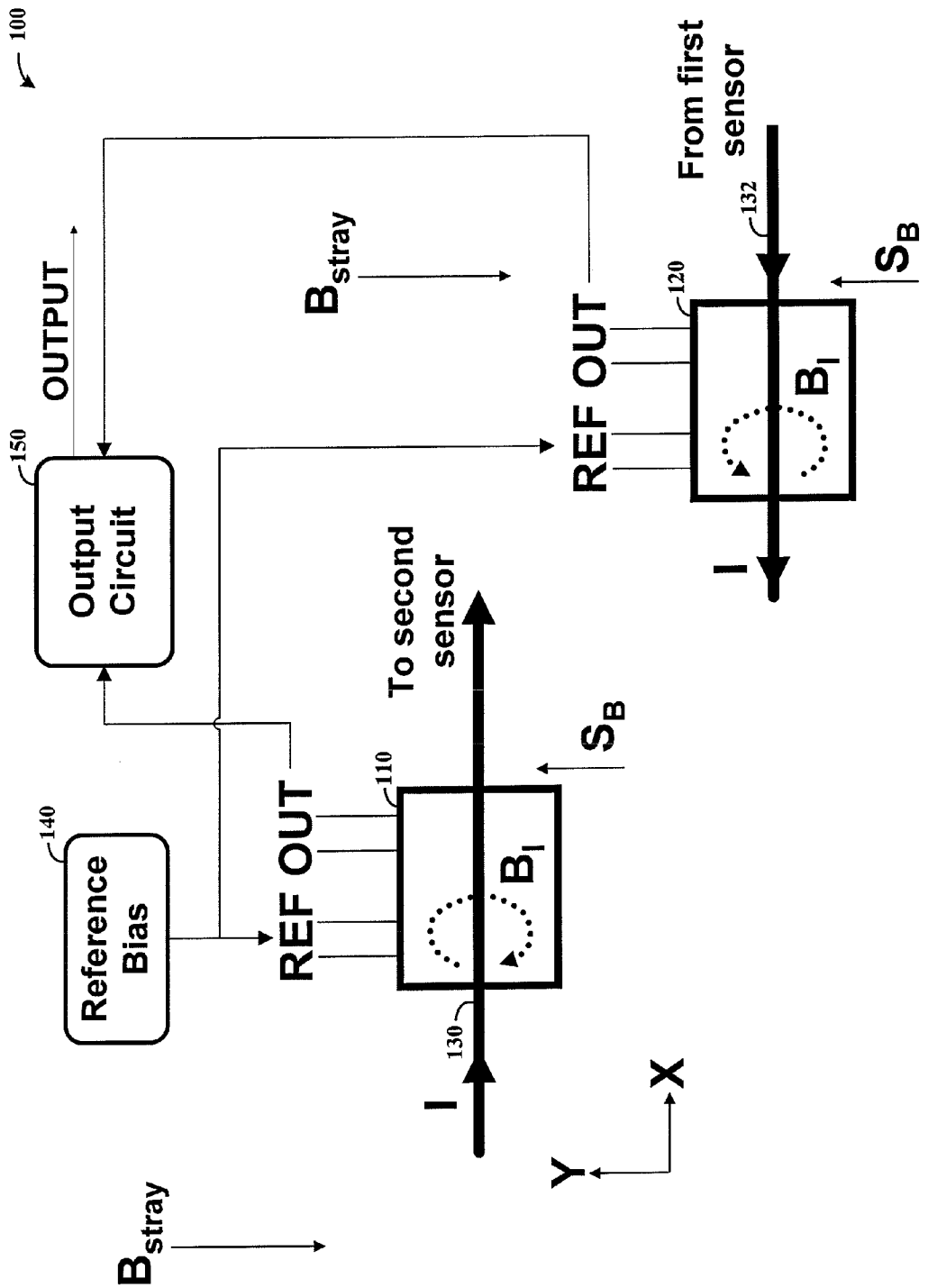
FIG. 1 shows a magnetic sensor circuit, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims. Furthermore, the term "example" as used throughout this document is by way of illustration, and not limitation.

The present invention is believed to be applicable to a variety of different types of processes, devices and arrangements for use with sensor applications, including magnetic current sensor applications. While the present invention is not necessarily so limited, various aspects of the invention may be appreciated through a discussion of examples using this context.

According to an example embodiment, a current sensor circuit is configured to facilitate the detection of a current-induced magnetic field in the presence of one or more stray magnetic fields. The current sensor circuit includes two or more sensors that are responsive to ambient magnetic fields, including a field generated by a current through a conductor, and any stray fields. Two of the sensors are arranged such that the current through the conductor passes in different directions through the respective sensors, with both sensors being arranged to detect any stray fields consistently.

Accordingly, the output of each sensor includes a component corresponding to the stray field as detected by each sensor. The sensors are maintained in relatively close proximity and implemented with common components such that the stray fields detected at each sensor are cancelled upon combining the outputs of the respective sensors from one another. Where the sensor sensitivity is a planar sensitivity, the stray fields that are reduced or canceled are generally coplanar with the current-generated field (e.g., both of the fields can be sensed by sensors). Combining the outputs may, for example, involve subtracting or adding the outputs depending on the configuration (e.g., the sensor orientation or sensor bias, and related signal polarities as may reverse upon rotation of a sensor 180 degrees or as biased differently). A remaining portion of the respective outputs thus corresponds to a field generated by current through the conductor.

Various embodiments are directed to implementation with a variety of different types of sensors. Some sensors used in connection with one or more embodiments operate in accordance with the Hall effect or the magnetoresistive effect. Anisotropic magnetoresistive (AMR) and giant magnetoresistive (GMR) sensors are particular examples of sensor types that operate using magnetoresistive effects. Hall effect sensors can be integrated monolithically into integrated circuits, which can be a relatively economical approach. Magnetoresistive sensors can be implemented with a generally higher sensitivity. For example, AMR sensors exhibit a much higher sensitivity compared to Hall effect sensors, and GMR sensors can achieve a sensitivity that is higher than that of AMR sensors.

Magnetoresistive sensors may involve additional fabrication steps relative to Hall effect sensors (e.g., relative to their ability to be monolithically integrated). For example, AMR sensors can be deposited by sputtering $Ni_{80}Fe_{20}$ on a separate die or on top of a monolithic structure. An annealing process, sometimes in a magnetic field, can be used for stabilizing the magneto-resistive material. GMR sensors can be formed in various thin layers and interfaces, which can involve relatively complex fabrication.

One or more types of Hall sensors can be used in conjunction with various example embodiments. In some implementations, Hall sensors are monolithically integrated into a semiconductor device and arranged to sense current-induced and stray fields as discussed herein. Several different types of Hall sensors (e.g., vertical) or other known semiconductor sensors can be used in accordance with one or more embodiments, such as a Hall plate, a magnetic field sensitive bipolar junction transistor (magnetotransistor), a magnetic field sensitive junction field-effect transistor (JFET), a magnetic field sensitive metal oxide semiconductor FET (MOSFET), a Hall sensor in the channel region of a MOSFET (MAGFET), or a Hall resistor. In some implementations, one or more sensors as described herein exhibit a main axis of magnetic sensitivity in the plane of a chip or substrate in which the sensor is located, such that they can be used in accordance with these embodiments. As would be understood, the plane of the chip, as referred to herein, may vary as may the fields detected (e.g., due to manufacturing conditions and sensitivity in a range of planar angles such as a few degrees to 25 degrees).

In some applications, a Hall plate sensor includes an N or P doped area of a semiconductor material with contacts used to drive current through the semiconductor (e.g., four contacts as described in connection with the following figures). Under the influence of the Lorentz force, the charge carriers initially deflect in response to a magnetic field applied perpendicular to the semiconductor surface, which results in a measurable voltage difference through the semiconductor material. The Hall plate can be used to detect a field generated by a current driven through a wire close to the Hall plate, as being responsive to current-induced field lines that pass through the Hall plate.

In some implementations, a wire on a printed circuit board (PCB) is used to convert current into a magnetic field for a sensor mounted on the PCB, on top of or otherwise immediately adjacent the wire. The distance between the sensor and the wire can be kept small to facilitate a strong field of the current. Flux concentrators can be used to concentrate and bend magnetic field lines, and the Hall plate is used to measure the magnetic field. Where two Hall plates are used, both plates are sensitive to stray fields from outside in the Z direction, whereas the to-be-measured field lines (induced by the current) in the Z direction have opposite signs. This effect can be used to reduce the sensitivity of stray fields in the Z direction by subtracting the sensor outputs. The Z-axis stray fields cancel while the desired fields corresponding to the current are added.

In another embodiment, a planar magnetic sensor is configured to detect an in-plane magnetic field. A reference current or voltage is applied to the sensor, and a corresponding output from the sensor is detected via output contacts. The output contacts are used to detect changes in the device that are responsive to magnetic fields, such as by detecting/providing an output for a differential current or voltage that corresponds to the applied magnetic field. The place and order of the reference contacts and output contacts may be set to suit the particular application, such as in view of an expected stray field, or the field of a conductor for which current is sensed. The sensor can be oriented to sense one or more magnetic fields, and can be used in connection with one or more additional sensors for mitigating the effect of stray fields.

Turning now to the figures, FIG. 1 shows a magnetic sensor circuit 100, according to an example embodiment of the present invention. The circuit 100 includes two sensors 110 and 120, which may be implemented as discussed in connection with one or more embodiments above. A conductor 130 passes current through sensor 110, with the current being passed through sensor 120 via conductor 132. The conductors 130 and 132 may, for example, be a continuous conductor or wire, or may include two or more different interconnected conductors. Similarly, the sensors 110 and 120 may be arranged as shown or otherwise, with both sensors being susceptible to a similar (or the same) stray magnetic field.

By way of example, the stray field is represented in the figure by the term $B_{stray}$ and its corresponding arrow. However, the circuit 100 and variations thereof may be used to detect and mitigate the effect of stray magnetic fields in other orientations, or of two or more such fields. For example, the respective sensors 110 and 120 and conductors 130 and 132 can be oriented differently to correspond to different stray fields, such as by positioning the sensors and the conductor such that the current passing through the conductor is generally perpendicular (e.g., within a few or several degrees of perpendicular), of the stray magnetic field. To suit applications involving an unpredictable field, a plurality of sensor pairs as shown can be implemented at varying degrees of angle relative to those shown, for mitigating the effects of stray magnetic fields at different orientations.

The sensors 110 and 120 can be implemented using one or more types of sensor circuits. In one embodiment, the sensors are planar magnetic sensors that detect an in-plane magnetic field (e.g., X or Y as shown). The sensor includes two reference contacts (REF) and two output contacts (OUT). A reference bias circuit 140 biases the reference contacts with a reference current or voltage, and the output contacts are used to detect changes in the device that are responsive to magnetic fields. For instance, under the influence of a magnetic field B in a sensitive direction $S_B$ (e.g., in the Y direction), a differential current or voltage can be measured at the output contacts due to a magnetic effect such as the Hall effect. The place and order of the reference contacts and output contacts may be changed as a function of the type of sensor function employed by the sensors 110 and 120, and are positioned as shown in FIG. 1 by way of example. As consistent with the above discussion, the sensors 110 and 120 can be rotatably positioned relative to the X or Y axes, to sense one or more of a combination of magnetic fields.

In some embodiments, the system 100 also includes an output circuit 150 that generates an output corresponding to magnetic fields sensed by the sensors. For example, the output circuit may be configured to generate a combined output of the sensors 110 and 120, by subtracting the values of each sensor to remove a portion of the sensor outputs corresponding to the sensed stray field $B_{stray}$.

In some implementations, the output circuit 150 calculates an output corresponding to an interference-reduced signal corresponding to current sensed in the conductors 130/132 as follows. In current measurement, a current through the conductors 130 and 132 generates a current-induced magnetic field $B_I$ in each of the sensors 110 and 120. The sensors sense the respective magnetic fields, both labeled $B_I$ given an expected similarity between the fields as corresponding to the same current source, as well as the stray field $B_{stray}$. The output of each sensor 110 and 120, respectively, is:

$$OUT_{110} = REF * S_B(B_I - B_{stray}).\quad\text{(Equation 1.a)}$$

$$OUT_{120} = REF * S_B(-B_I - B_{stray}).\quad\text{(Equation 1.b)}$$

The effect of the stray fields is compensated in the output circuit 150 by subtracting the fields to generate a combined output (of the output circuit 150) as follows:

$$OUT = REF*(S_B(B_I - B_{stray}) - S_B(-B_I - B_{stray})) = REF*(2S_BB_I)\quad\text{(Equation 2)}$$

This combined output can be passed, for example, for providing an indication of a characteristic of the current passing through the conductors 130 and 132.

The output circuit 150 may include one or more of a variety of circuits. For example, the output circuit 150 may include one or more circuits that carry out the mathematical functions as characterized above in Equations 1.a, 1.b or 2 above. In more complex embodiments, the output circuit 150 includes a computer processor that generates an output indicative of a characteristic of the current in the conductors 130 and 132, such as by generating an output indicative of a current value.

In some implementations, the magnetic sensor circuit 100 is implemented with first and second magnetic field sensors as follows. The first magnetic field sensor (110) senses a stray magnetic field and a first current-induced magnetic field generated by current flow through the conductor (130/132). The second magnetic field sensor (120) configured and arranged to sense the stray magnetic field and a second current-induced magnetic field generated by the current flow through the conductor (130/132), the second current-induced magnetic field being opposite the first current-induced magnetic field sensed by the first magnetic field sensor. The fields are "opposite" in that the current flowing past each sensor flows in an opposite direction, relative to current flowing past the other sensor, which results in opposite fields (i.e., fields that are opposite in sign) being applied to the sensors. The current-induced magnetic fields and the stray magnetic field are coplanar, and each magnetic field sensor circuit provides an output that, when combined with the output of the other sensor, cancels a portion of each output corresponding to the stray magnetic field.

Figure 2:
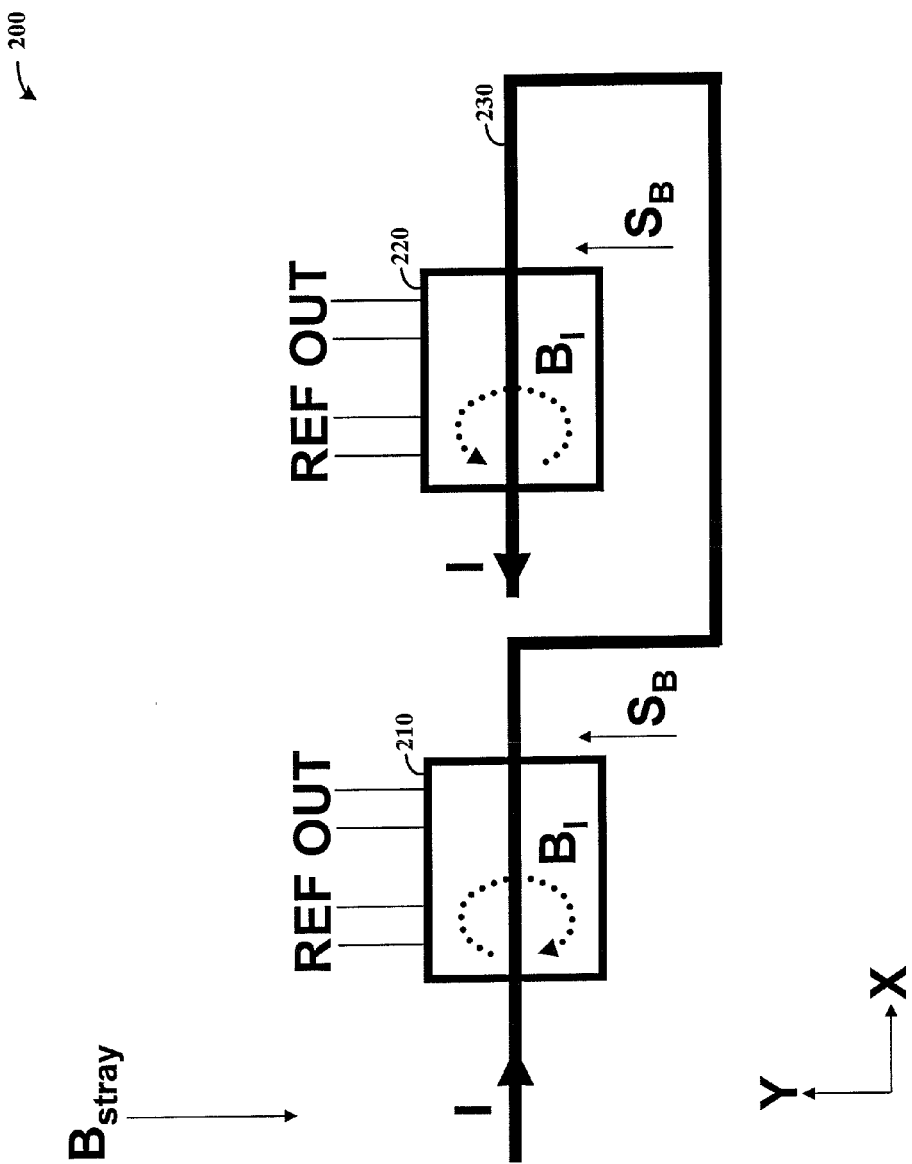
FIG. 2 shows another magnetic sensor circuit for sensing current in a generally collinear circuit arrangement, according to another example embodiment of the present invention.

FIG. 2 shows another magnetic sensor circuit 200 for sensing current in a generally collinear circuit arrangement, according to another example embodiment of the present invention. The circuit 200 includes sensors 210 and 220 located adjacent one another, with a conductor 230 passing current through each sensor in a generally collinear fashion. The circuit 200 may, for example, be implemented in a manner similar to that of the circuit 100 shown in FIG. 1, using similar components and functions.

Here, the sensors 210 and 220 are located adjacent or over the conductor 230, via which current is passed in a first X direction (left to right for illustrative purposes) through the first sensor 210. The same current is passed through sensor 220 via conductor 230 in an opposite X direction (right to left) relative to the current passed through sensor 210. The corresponding magnetic fields sensed in each circuit include current-induced fields of opposite sign in the Y direction, as well as a stray field represented by $B_{stray}$.

The circuit 200 may also be implemented with an output circuit such as circuit 150 shown in FIG. 1, and with a corresponding reference bias circuit 140 to apply a bias to the respective sensors 210 and 220. Such an output circuit can be used to generate a combined output having stray field-induced interference reduced or eliminated. Using Equation 2 above, the net combined output of both sensors is again:

$$OUT = REF*(2S_BB_I).\quad\text{(Equation 3)}$$

Using this approach, some or all of the stray field is cancelled. In some implementations, the fields in X and Z direction have no influence on the measurement, as the sensor is not sensitive in X and Z direction.

Figure 3:
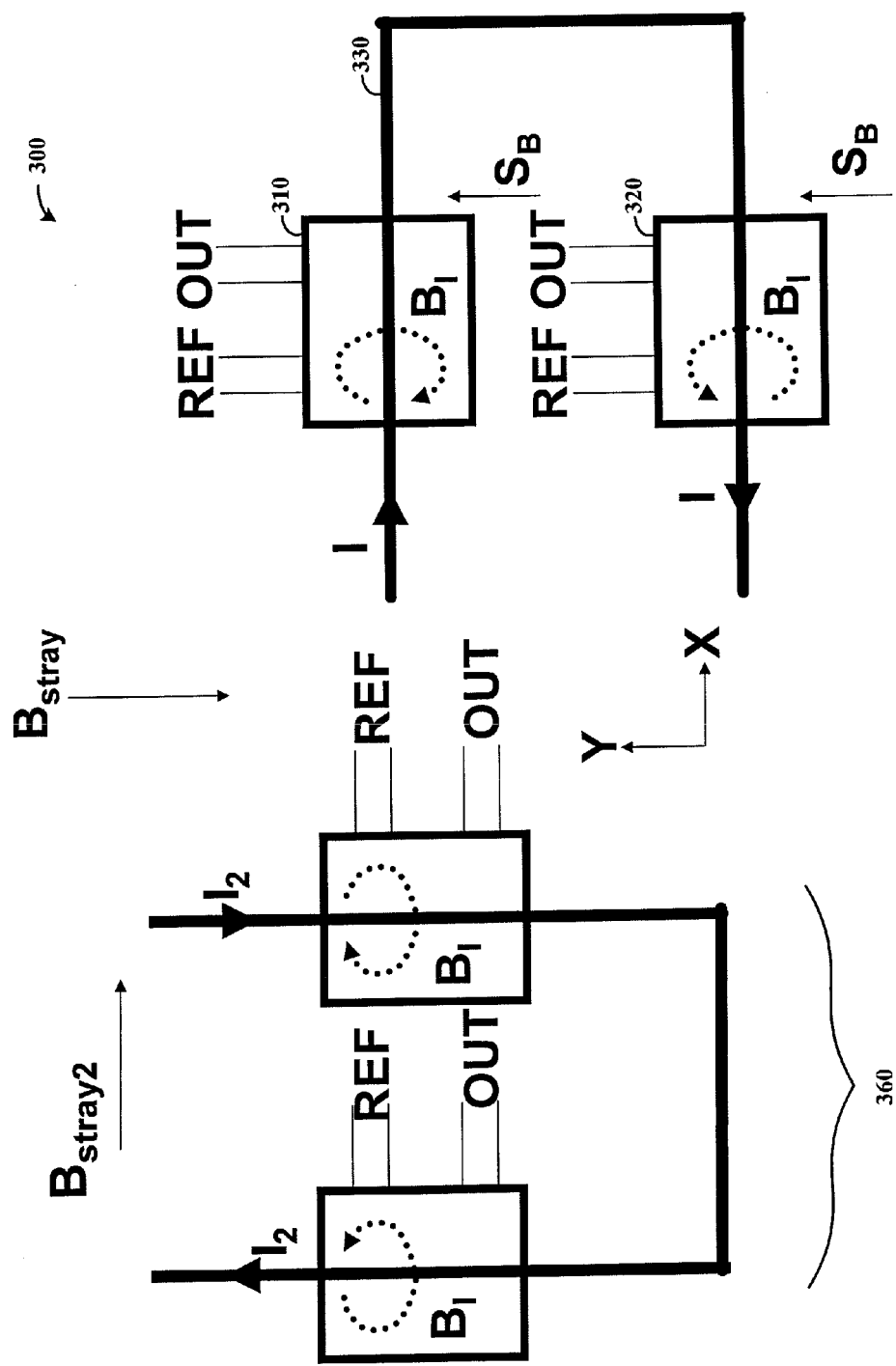
FIG. 3 shows another magnetic sensor circuit for sensing current in a generally parallel circuit arrangement, according to another example embodiment of the present invention.

FIG. 3 shows another magnetic sensor circuit 300 for sensing current in a generally parallel circuit arrangement, according to another example embodiment of the present invention. The circuit 300 includes sensors 310 and 320 located adjacent one another in the Y direction, with a conductor 330 passing current through each sensor. The circuit 300 may, for example, be implemented in a manner similar to that of the circuit 100 shown in FIG. 1, using similar components and functions.

The sensors 310 and 320 are located adjacent or over the conductor 330, via which current is passed in a first X direction (left to right for illustrative purposes) through sensor 310. The same current is passed through sensor 320 via conductor 330 in an opposite X direction (right to left) relative to the current passed through sensor 310. The corresponding magnetic fields sensed in each circuit include current-induced fields of opposite sign in the Y direction, as well as a stray field represented by $B_{stray}$. The current generated magnetic field has opposite signs for both sensors, while the stray field has the same sign for both sensors. Relative to the approach shown in FIG. 2, this approach may be useful for implementation in applications susceptible to variations in stray field $B_{stray}$ in the X direction.

The circuit 300 may also be implemented with an output circuit such as circuit 150 shown in FIG. 1, and with a corresponding reference bias circuit 140 to apply a bias to the respective sensors 310 and 320. Such an output circuit can be used to generate a combined output having stray field-induced interference reduced or eliminated. Using Equation 2 above, the net combined output of both sensors is again as in Equation 3.

The conductors via which current flow may be detected can include one or more of a variety of types of conductors to suit the application. For example, the conductors 130, 230 and 330 as shown in the figures may be a leadframe wire, a wire formed on a printed circuit board, an on-chip wire, or another externally-connected wire that can carry larger currents than an on-chip wire used in connection with the sensor circuits may be capable of carrying.

As consistent with the above, other embodiments are directed to the use of more than one pair of sensors. For example, if two X sensors and two Y sensors are combined on the same chip for planar (X, Y) sensing, the magnetic field in two perpendicular current directions can be measured, with built-in cancellation of the effect of stray fields. Referring again to FIG. 3, such an approach may be implemented using another pair of sensors such as sensor circuit 360, having characteristics similar to those in the sensors 310 and 320 and the related conductor 330. The sensor circuit 360 is oriented for detecting current flow $I_2$ and a stray field $B_{stray2}$ in the X direction. In some implementations, the current $I_2$ is the same as current $I_1$, with the conductors through all four sensors being connected to flow the current through the conductors and adjacent the sensors as shown.

Based upon the above discussion and illustrations, those skilled in the art will readily recognize that various modifications and changes may be made to the present invention without strictly following the exemplary embodiments and applications illustrated and described herein. For example, different types of sensors, such as different types of magnetoresistive sensors, Hall sensors or other sensors susceptible to in-plane interference, may be implemented in addition to and or as an alternative to the sensors discussed in connection with the various embodiments above. Such modifications do not depart from the true spirit and scope of the present invention, including that set forth in the following claims.

What is claimed is:

1. A current sensor circuit comprising:
   a first magnetic field sensor configured and arranged to sense a stray magnetic field and a first current-induced magnetic field generated by current flow through a conductor; and
   a second magnetic field sensor configured and arranged to sense the stray magnetic field and a second current-induced magnetic field generated by the current flow through the conductor, the second current-induced magnetic field having an orientation that is different than the first current-induced magnetic field sensed by the first magnetic field sensor,
   the current-induced magnetic fields and the stray magnetic field being coplanar, each magnetic field sensor circuit being configured to provide an output that, when combined with an output of the other magnetic field sensor, cancels a portion of each output corresponding to the stray magnetic field.

2. The circuit of claim 1, further including an output circuit configured to combine outputs of the magnetic field sensors by
   subtracting an output of one of the sensors from an output of the other one of the sensors to cancel the portions of each output corresponding to the stray magnetic field, in response to the stray magnetic fields having a common polarity, and
   adding an output of one of the sensors to an output of the other one of the sensors to cancel the portions of each output corresponding to the stray magnetic field, in response to the stray magnetic fields having a different polarity.

3. The circuit of claim 1, further including a bias circuit configured to apply a bias to the sensors, each sensor being configured to generate an output in response to the bias and that characterizes the sensed current-induced field and stray magnetic field.

4. The circuit of claim 1, further comprising the conductor, and further including an output circuit configured and arranged to subtract the first current-induced magnetic field from the stray magnetic field sensed by the first magnetic field sensor and subtract the second current-induced magnetic field from the stray magnetic field sensed by the second magnetic field sensor, to generate combined outputs of the magnetic field sensors.

5. The circuit of claim 1, wherein the second sensor is oriented to detect the current-induced magnetic field having a direction that is opposite the direction of the magnetic field detected by the first sensor.

6. The circuit of claim 1, wherein the first and second magnetic field sensors are arranged to sense current-induced magnetic fields from different portions of the conductor that are collinear with one another, and that flow the current in opposite directions.

7. The circuit of claim 1, wherein the first and second magnetic field sensors are laterally adjacent one another along an axis that is perpendicular with the stray magnetic field.

8. The circuit of claim 1, wherein the first and second magnetic field sensors are arranged to sense current-induced magnetic fields from different, non-linear portions of the conductor.

9. The circuit of claim 1, wherein the first and second magnetic field sensors are arranged to sense current-induced magnetic fields from different portions of the conductor that are non-linear with one another, and that flow the current in opposite directions that are parallel to one another.

10. The circuit of claim 1, wherein the first and second magnetic field sensors are adjacent one another along an axis that is parallel with the stray magnetic field.

11. The circuit of claim 1, wherein the conductor is arranged on a substrate and the first and second magnetic field sensors are arranged over different portions of the conductor.

12. The circuit of claim 1,
    further including third and fourth magnetic field sensors respectively configured and arranged to sense a different stray magnetic field and opposite current-induced magnetic fields generated by current flow through a conductor, and
    wherein the first and second magnetic field sensors are aligned to sense the stray magnetic field, and the third and fourth magnetic field sensors are aligned to sense the different stray magnetic field.

13. An integrated circuit chip for sensing current in a conductor that is arranged to flow current in opposite directions, the chip comprising:
    a semiconductor substrate;
    a first magnetic field sensor over a first portion of the conductor and configured and arranged to sense a stray magnetic field and a first current-induced magnetic field generated by current flowing through the first portion of the conductor, the stray magnetic field and the first current-induced magnetic field being coplanar;
    a second magnetic field sensor over a second portion of the conductor, and configured and arranged to sense the stray magnetic field and a second current-induced magnetic field generated by current flowing through the second portion of the conductor, the second current-induced magnetic field being opposite the first current-induced magnetic field sensed by the first magnetic field sensor, the stray magnetic field and the second current-induced magnetic field being coplanar; and
    an output circuit configured to process outputs of the sensors to cancel the portions of each output corresponding to the stray magnetic field, and to provide a result of the processing as an output indicative of an amount of current flowing through the conductor.

14. The circuit of claim 13, further including a bias circuit configured to apply a bias to the sensors, each sensor being configured to generate an output that corresponds to the bias and that characterizes the sensed current-induced field and stray magnetic field, and further including an output circuit configured and arranged to subtract the first current-induced magnetic field from the stray magnetic field sensed by the first magnetic field sensor and subtract the second current-induced magnetic field from the stray magnetic field sensed by the second magnetic field sensor, to generate combined outputs of the magnetic field sensors.

15. The circuit of claim 13, wherein each of the first and second magnetic field sensors includes at least one of a bipolar magnetotransistor, a magnetic field sensitive junction field-effect transistor (JFET), a magnetic field sensitive metal oxide semiconductor FET (MOSFET), a vertical Hall sensor, or a Hall resistor, and has a main axis of magnetic sensitivity in the plane of the chip.

16. The circuit of claim 13,
wherein each of the first and second magnetic field sensors includes a doped region in the substrate and contacts at different portions of the doped region for driving current through the doped region,
further including a bias circuit connected to the contacts and configured to apply a bias to the contacts,
each sensor being configured to generate an output that corresponds to the bias and that characterizes the sensed current-induced field and stray magnetic field in the doped region.

17. A method for sensing current, the method comprising:
sensing, with a first magnetic field sensor, a stray magnetic field and a first current-induced magnetic field generated by current flow through a conductor; and
sensing, with a second magnetic field sensor, the stray magnetic field and a second current-induced magnetic field generated by the current flow through the conductor, the second current-induced magnetic field being opposite the first current-induced magnetic field sensed by the first magnetic field sensor,
the current-induced magnetic fields and the stray magnetic field being coplanar, the outputs of each magnetic field sensor circuit, when combined, cancelling a portion of each output corresponding to the stray magnetic field.

18. The method of claim 17, further including subtracting an output of one of the sensors from an output of the other one of the sensors to cancel the portions of each output corresponding to the stray magnetic field.

19. The method of claim 17, further including applying a bias to the sensors to cause the sensors to generate an output that corresponds to the bias and that characterizes the sensed current-induced field and stray magnetic field.

20. The method of claim 17, further including
processing outputs of the sensors to cancel the portions of each output corresponding to the stray magnetic field, and
providing a result of the processing as an output indicative of an amount of current flowing through the conductors.

* * * * *